United States Patent [19]
Yumi

[11] Patent Number: 5,569,877
[45] Date of Patent: Oct. 29, 1996

[54] SEWN MATERIAL AND METHOD FOR SHIELDING AGAINST ELECTROMAGNETIC WAVES

[75] Inventor: Hideo Yumi, Nagoya, Japan

[73] Assignee: Kitagawa Industries Co., Ltd., Nagoya, Japan

[21] Appl. No.: 418,493

[22] Filed: Apr. 7, 1995

[30] Foreign Application Priority Data

Apr. 14, 1994 [JP] Japan .................................. 6-075936

[51] Int. Cl.⁶ ...................................................... H05K 9/00
[52] U.S. Cl. ................................ 174/35 GC; 174/35 MS; 174/35 R; 428/36.1
[58] Field of Search .............................. 174/35 R, 35 MS, 174/35 GC; 428/209, 920, 36.1, 36.2, 36.3, 36.5, 36.8, 36.91; 66/202; 139/425 R, 426 R

[56] References Cited

U.S. PATENT DOCUMENTS

| | | | |
|---|---|---|---|
| 3,752,899 | 8/1973 | Bakker | 174/35 GC |
| 4,288,081 | 9/1981 | Sado | 277/1 |
| 4,381,805 | 5/1983 | Troy | 139/391 |
| 4,520,562 | 6/1985 | Sado et al. | 29/878 |
| 4,678,699 | 7/1987 | Kritchevsky et al. | 428/175 |
| 4,857,668 | 8/1989 | Buonanno | 174/35 GC |
| 4,921,751 | 5/1990 | Wakahara et al. | 428/229 |
| 4,931,326 | 6/1990 | Weil | 428/35.8 |
| 5,028,739 | 7/1991 | Keyser et al. | 174/35 GC |
| 5,045,635 | 9/1991 | Kaplo et al. | 174/35 GC |
| 5,399,418 | 3/1995 | Hartmanns et al. | 428/218 |

FOREIGN PATENT DOCUMENTS

| | | | |
|---|---|---|---|
| 0275171 | 7/1988 | European Pat. Off. | |
| 234880 | 9/1990 | Japan . | |
| 5315784 | 11/1993 | Japan | 174/35 GC |
| 2098808 | 11/1982 | United Kingdom . | |
| 2250382 | 3/1992 | United Kingdom | 174/35 GC |

*Primary Examiner*—Bot L. Ledynh
*Attorney, Agent, or Firm*—Davis and Bujold

[57] ABSTRACT

A sewn material for shielding against electromagnetic waves is provided without increasing the number of stitch perforations created when sewing electrically conductive threads to a base material. Two electrically conductive threads are sewn on at least one edge of a strip of elastomeric base material in an over-edge chain stitch that extends across the edge surface of the base material. Portions of the threads are partly exposed on the edge surface and other portions of the threads are sewn through the base material, thereby providing dual shield layers for shielding against electromagnetic waves entering from the side of the base material.

20 Claims, 11 Drawing Sheets

SEWN MATERIAL AND METHOD FOR SHIELDING AGAINST ELECTROMAGNETIC WAVES

FIELD OF THE INVENTION

This invention relates to a sewn electromagnetic wave shielding material for protecting electrical apparatus and signal conductors against trouble-causing electromagnetic energy radiated from an electromagnetic wave source.

BACKGROUND OF THE INVENTION

Various prior art shielding materials are presently used for preventing the leakage and infiltration of electromagnetic waves through the gap between an edge, defining an opening in a housing of an electrical apparatus, and a lid for closing the opening or a part for connecting the housing and the lid.

For example, the U.S. Pat. No. 4,857,668 proposes a gasket in the form of an electrically conductive sheath attached around a bar-shaped elastic core. If such a gasket is deformed when attached to a curved or bent part, however, the surface of the gasket becomes creased, thereby producing gaps between the gasket surface and the part to which the gasket is attached. A gap between a housing and a corresponding lid, for example, cannot be securely sealed by such a gasket. Therefore, this type of gasket cannot be effectively used on curved or bent parts.

Another shielding material is described in the Japanese examined and published utility model application No. 2-34880. The disclosed shielding material is formed by sewing electrically conductive threads to an elastomeric sheet consisting of silicone rubber or other elastic material. When this type of shield material is attached to the housing of electronic components, the electrically conductive threads sewn to the elastomeric sheet continuously engaging with both the housing and the lid between which the shielding material is mounted. This ensures a continuous electrical path through the gap between the housing and the lid, thereby protecting the gap against the passage of electromagnetic waves. Moreover, even if the elastomeric sheet is deformed and creased, the electrically conductive threads do not become creased. Therefore, the shielding material deforms, conforming to the configuration of the part to which the material is attached without creasing.

Shield material attached to an edge defining an opening in a housing or other part has to shield against passage of electromagnetic waves through the gap between the housing and the lid or infiltration of electromagnetic waves through the side surface of the elastomeric sheet. In the prior art shielding material, only the electrically conductive threads sewn through the elastomeric sheet form a shielding layer for shielding against electromagnetic waves entering from the side surface of the elastomeric sheet. Moreover, the electrically conductive threads in this layer are only stitched at discrete intervals. Therefore, in order to provide sufficient shielding effectiveness, the electrically conductive threads have to be closely stitched, forming a plurality of closely spaced shielding layers. Such a solution increases the number of stitches in the substrate, thereby deteriorating the strength of the substrate.

SUMMARY OF THE INVENTION

Wherefore, an object of this invention is to provide a sewn material for sufficiently shielding against electromagnetic waves without having to increase the number of stitches of electrically conductive threads passing through the elastomeric base layer.

To attain this and other objects, the present invention provides a sewn shielding material composed of an electrically conductive material sewn to an elastic base material. The sewn material is formed along at least one major surface of the base material with over-edge chain stitches extending over at least one edge surface using at least one electrically conductive thread.

When sewn shielding material according to the present invention is attached to the edge of an opening in a housing, for example, and the opening is closed by a lid, the elastic base material is elastically deformed according to the configuration of the gap between the housing and the lid, thereby filling the gap. Thus, the interior of the housing is protected from water and air.

Exposed portions of the electrically conductive threads sewn such that they surround the side edge of the base material, with over-edge stitches, are continuously placed into contact with the housing and the lid between which the shielding material is held, thereby conducting electricity through the gap between the housing and the lid. The electrically conductive threads serve as a shielding layer for shielding against the passage of electromagnetic waves between the housing and the lid. Moreover, by sewing the electrically conductive threads in and surrounding the edges of the base material, the side surfaces of base material are covered with threads extending longitudinally and transversely across the side surfaces. At the same time, the electrically conductive threads are sewn through stitch perforations made in the base material. Therefore, the base material is dually shielded by the electrically conductive threads exposed on the side edge surfaces and those sewn through the opposing major surfaces of the base material.

When the sewn shielding material is held between the housing and the lid during use, portions of the electrically conductive threads are exposed on the opposing major surfaces of the base material and form a continuous electrical path through the gap between the housing and the lid. The electrically conductive threads sewn so as to surround the side edges of the base material with over-edge chain stitches form dual electromagnetic shield layers between the housing and the lid, thereby effectively shielding against the electromagnetic waves.

The electrically conductive threads are sewn by over-edge chain stitching without increasing the number of stitches, even when compared with single stitching. Therefore, the strength of the base material is not deteriorated.

Even if the shielding material with the electrically conductive threads sewn thereto is deformed during use, the surface of the shielding material does not become creased. Whereas conventional shielding sheaths composed of the electrically conductive material attached around the base material become creased when they are deformed. Thus gaps between the components supporting the shielding material can be securely sealed against electromagnetic waves with shielding material according to the present invention.

The electrically conductive threads may be formed of copper, stainless, aluminum or other available metals. In addition, non-metallic threads plated with metal or threads formed of organic electrically conductive resin, such as polyaniline, can be used. Alternatively, mixtures or combinations of these threads can be used.

Elastomeric, foams, non-woven cloth or other resilient materials can be used as the base material.

The electrically conductive material is preferably sewn to the elastic base material with over-edge chain stitches that extend both transversely across and longitudinally along the side surfaces of the base material using two electrically conductive threads that are linked together on the side surface.

By tightly drawing the free ends of the threads, knots are formed in the sewn material. Even when the sewn shielding material is cut, the threads can be easily tangled by tightly drawing the cut ends of the electrically conductive threads, thereby preventing the threads from loosening and/or unraveling.

In the sewn material of over-edge stitching, two electrically conductive threads are engaged with each other on at least one side edge surface of the base material, thereby providing better electrical conductivity between the threads than in sewn material having no such engagement. Consequently, superior electromagnetic wave shielding is assured.

The elastic base material is preferably provided with an electrical conductivity. In this case, the base material also shields against electromagnetic waves. Shielding materials having such an electrically conductive base material have enhanced the shielding of electromagnetic waves.

The base material is preferably provided with flame retardant substance. Furthermore, the side of the base material to which the electrically conductive threads are sewn is preferably provided with a layer of flame retardant resin. The electrically conductive threads are partly embedded in the resin layer. In this manner, the shielding material is made flame retardant. Thus, the shielding material according to the invention can be used in safety, even in locations which tend to easily catch fire.

By sewing or fastening a film of flame retardant resin onto the base material with electrically conductive threads, and subsequently heating the film, the film is melted and secured to the base material. At the same time, the electrically conductive threads are partially embedded in the molten film. This process facilitates the production of the sewn shielding material.

BRIEF DESCRIPTION OF THE DRAWING FIGURES

The invention will now be described, by way of example, with reference to the drawings, in which.

DETAILED DESCRIPTION OF THE PREFERRED EMBODIMENTS

Figure 1A:
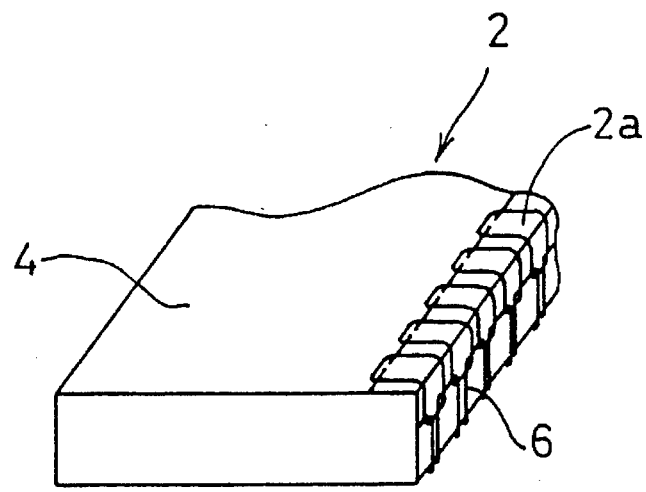
FIG. 1A is a perspective view partly showing the structure of a sewn shielding sheet according to a first embodiment of the invention.
Figure 1B:
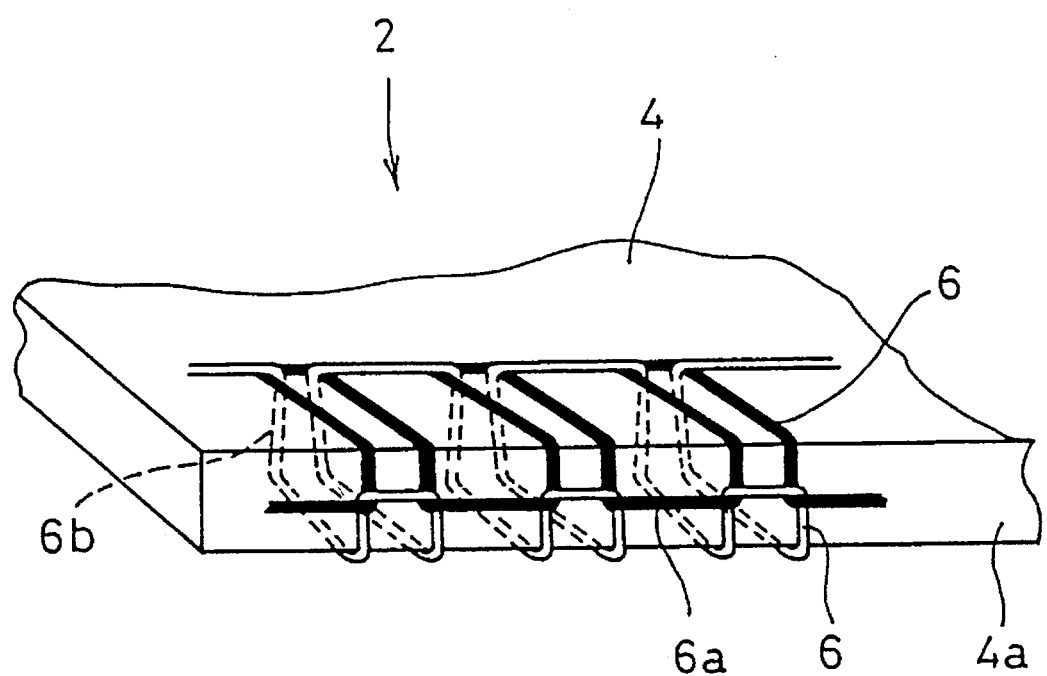
FIG. 1B is an enlarged view partly showing a side surface of the sewn shielding sheet of the first embodiment.

As shown in FIG. 1A, in a first embodiment of the invention, a sewn shielding sheet 2 is composed of an elongate strip or sheet of elastomeric material 4. Along the edge of the elastomeric sheet 4, a sewn web material 2a, of electrically conductive threads 6, is formed by over-edge chain stitches that extend transversely across these edge surfaces, using two electrically conductive threads 6. As shown in FIG. 1B, the electrically conductive threads 6 have through portions 6b in perforations formed through the elastomeric sheet 4 and exposed portions 6a overlying the surface 4a of the elastomeric sheet 4. The through portions 6b are sewn through the elastomeric sheet 4 at specified intervals along the length of the side surface 4a, thereby shielding against electromagnetic waves entering from the side surface 4a. The side surface 4a is clad with exposed portions 6a forming another shielding layer for shielding against electromagnetic waves infiltrating from the side surface 4a. Thus, dual shielding layers are formed by the exposed portions 6a and through portions 6b of the conductive threads.

Figure 1C:
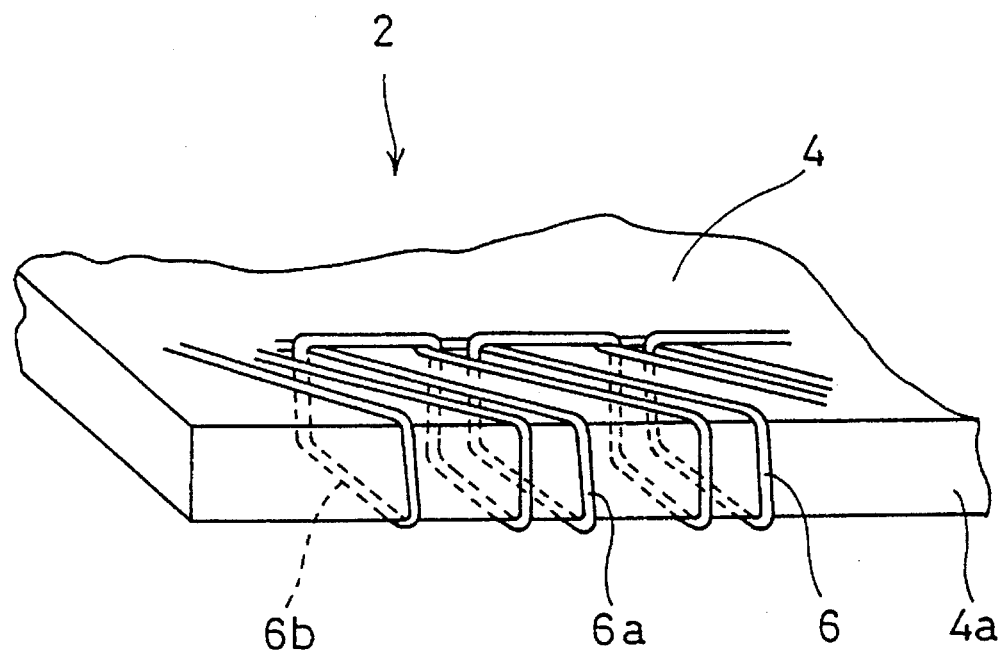
FIG. 1C is an enlarged view partly showing a side surface of the shielding sheet sewn using a single thread.

As shown in FIG. 1C, the aforementioned exposed and through portions 6a and 6b can be formed using a single thread 6, instead of two threads, thereby providing dual shielding layers.

The elastomeric sheet 4 may be formed of an elastomer having electrically conductive particles dispersed therein, thereby providing the elastomeric sheet with electrical conductivity. Available elastomers, such as neoprene, chloroprene, silicone or other rubber may be used to form the elastomeric sheet 4. Alternatively, polyolefin or other thermoplastic material can be used. An elastic high molecular compound can also be used. The elastomer can take the form of a packed or foam body. The electrically conductive particles dispersed in elastomer may be produced from carbon black, carbon fiber, graphite or other carbon. Alternatively, silver, copper, aluminum, chromium, titanium, tungsten, cobalt, zinc or alloys of these metals, such as nichrome, can be used. Further glass particles or fibers plated with such metals can be used. The electrically conductive particles can take the form of powder, foil or fiber.

The electrically conductive threads 6 are preferably formed of a plurality of threads of metal plated synthetic fiber.

The sewn shielding sheet 2 having the aforementioned structure can be bonded, adhered or otherwise secured to the edge of an opening in a housing for an electrical apparatus or other device provided with a lid for closing the opening.

The sewn shielding sheet 2 is secured such that the upper and lower surfaces of the elastomeric sheet 4 contact the edge defining the opening in the housing and the lid.

When the lid is closed, the elastomeric sheet 4 is deformed, conforming to the configuration of the irregular gap between the housing and the lid, the gap is physically sealed by the deformed sheet 4. The electrically conductive elastomeric sheet 4 and the electrically conductive threads 6 sewn in the elastomeric sheet 4 are in electrical contact with both the housing and the lid, thereby shielding against the passage of electromagnetic waves therebetween.

As aforementioned, in the first embodiment of the invention, the elastomeric sheet 4 of the sewn shielding sheet 2 is provided with electrical conductivity. The side surface 4a as well as the portions of the upper and lower surfaces adjacent the side surface 4a are covered with the electrically conductive threads 6.

Therefore, when a gasket formed of the sewn shielding sheet 2 is attached to the edge of the opening in the housing and the lid is closed over the opening, the elastomeric sheet fills the gap between the housing and the lid. By contacting both the housing and the lid, the electrically conductive threads 6 ensure electrical conduction between the housing and the lid. Furthermore, large portions of the electrically conductive threads are exposed on the opposite surfaces of the elastomeric sheet 4, thereby enhancing the electrical contact between these surfaces, the housing and the lid.

The electrically conductive threads 6 sewn to the elastomeric sheet 4 form dual shielding layers for shielding against electromagnetic waves infiltrating through the side surface 4a, thereby effectively shielding the gap between the housing and the lid against the passage of electromagnetic waves therethrough.

Although the elastomeric sheet 4 alone can sufficiently seal the gap, it has less conductivity than the electrically conductive threads 6. In the first embodiment, by sewing the electrically conductive threads 6 having superior conductivity to the elastomeric sheet 4, more effective shielding is provided against the infiltration of electromagnetic waves through the side surface 4a than is provided by an electrically conductive elastomeric sheet alone.

By tightly drawing the ends of the two electrically conductive threads 6, knots are automatically formed in the woven shielding sheet 2 due to the over-edge chain stitches extending across the edges. After being cut to the desired length, the ends of the electrically conductive threads 6 can be easily knotted or tied, thereby preventing the electrically conductive threads 6 from loosening and/or unraveling.

In the first embodiment, by using two electrically conductive threads 6, the side surface of the elastomeric sheet 4 is surrounded by over-edge chain stitches extending along and across the side surface. This does not increase the number of stitch perforations and therefore does not deteriorate the strength of the elastomeric sheet 4 to which the electrically conductive threads 6 are sewn, as compared with single stitching.

Figure 2A:
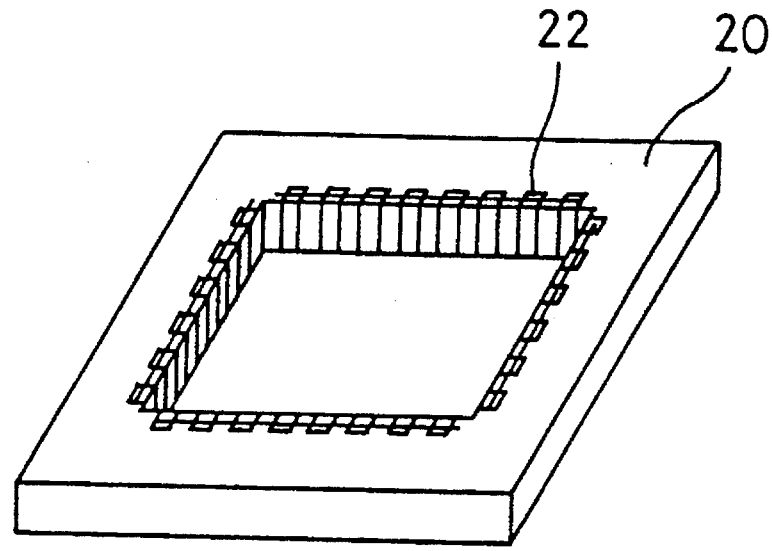
FIGS. 2A and 2B illustrate the sewn shielding sheet taking the form of differently shaped gaskets.
Figure 2B:
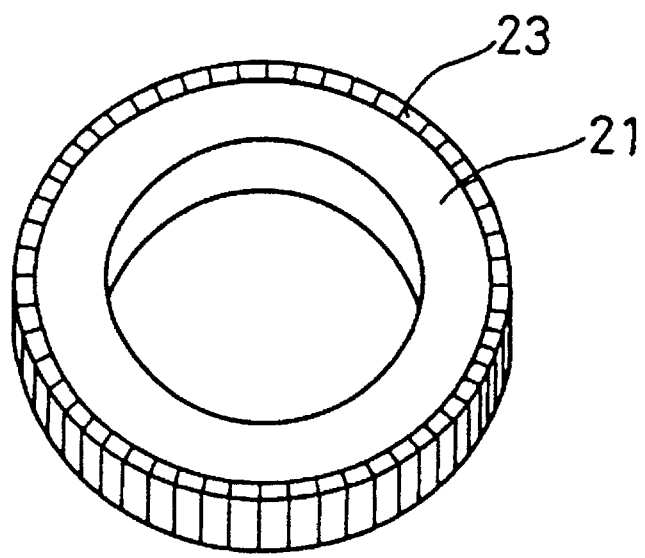

The elastomeric sheet may be cut to any desired shape, according to the shape of the article to be shielded against electromagnetic waves. As shown in FIGS. 2A and 2B, a gasket to be attached to an edge defining an opening in a housing for an electrical apparatus has a hollow square or annular cross section according to the configuration of the edge. The gasket shown in FIG. 2A is formed by sewing the inner peripheral edge of the hollow elastomeric sheet 20 with electrically conductive threads 22. The gasket shown in FIG. 2B is formed by sewing the outer peripheral edge of a hollow elastomeric sheet 21 with electrically conductive threads 23. These shielding gaskets provide the same shielding effectiveness as that of the aforementioned sewn shielding sheet 2. Both the inner periphery and the outer periphery of the respective sheets 20, 21 can be sewn with the electrically conductive threads, providing even more effective shielding against electromagnetic waves.

Figure 3:
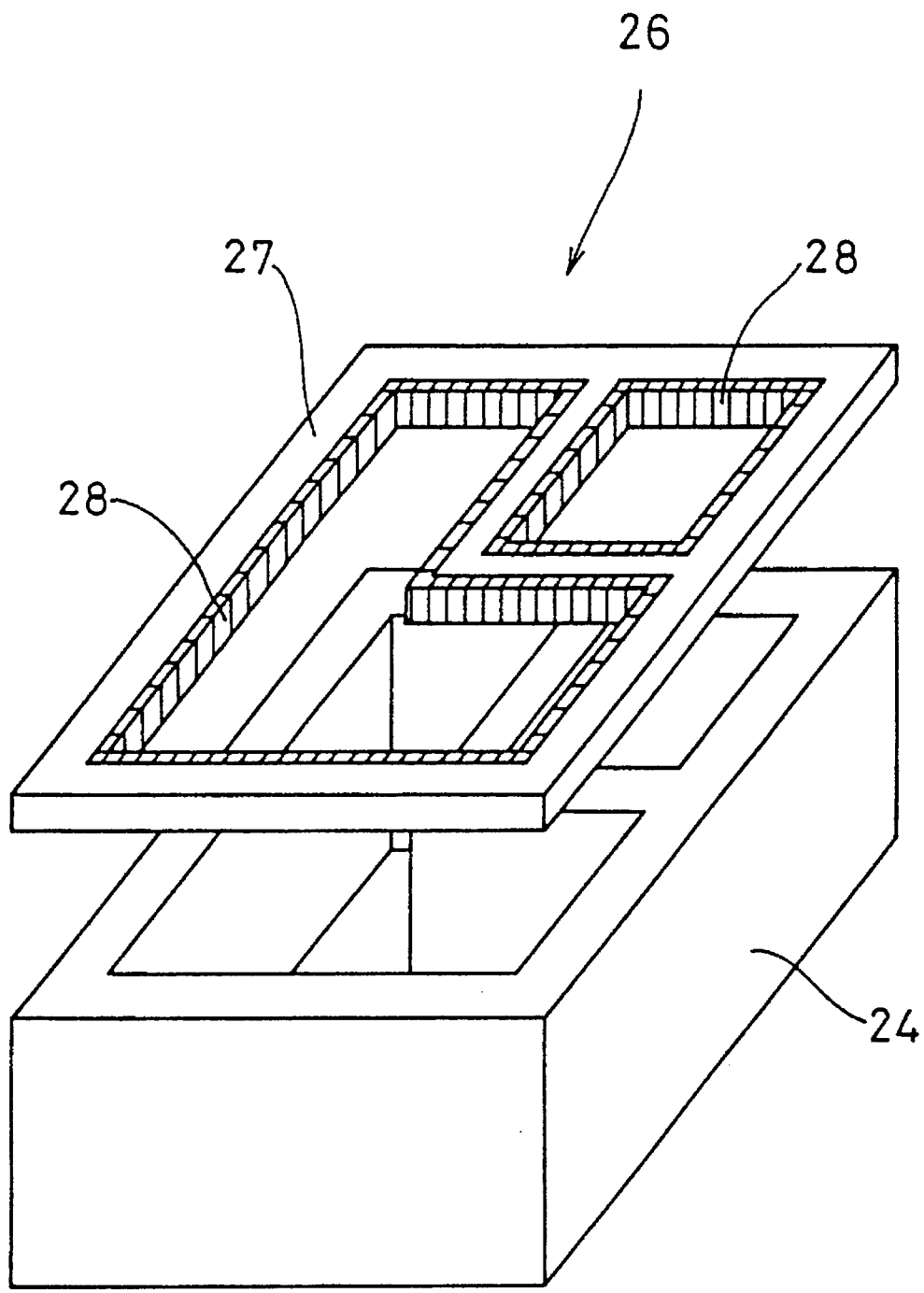
FIG. 3 is a perspective view of a sewn shielding sheet, as shown in FIGS. 1A and 1B, mounted on a case having a partitioned interior.

As shown in FIG. 3, a sewn shielding gasket 26 is mounted on a housing 24, the interior of which is partitioned into a plurality of sections. In order to form the shielding gasket 26, a plurality of openings are provided in an elastomeric sheet 27 that correspond to the sections in the case 24. The inner peripheral edges of the openings are sewn with electrically conductive threads 28. When the sewn shielding gasket 26 is mounted to the housing 24 and a not-shown lid is closed over the housing 24, the sections in the housing 24 are each safely shielded from electromagnetic waves. Therefore, even if electromagnetic waves are generated in one section of the housing 24, the waves are prevented from leaking into another section in the housing 24.

The configuration of the sewn shielding sheet can be adjusted to the configuration of virtually any part to which the sheet is to be attached. The electrically conductive threads can be sewn anywhere on the sheet as long as a side edge of the sheet is surrounded by the threads.

Figure 4:
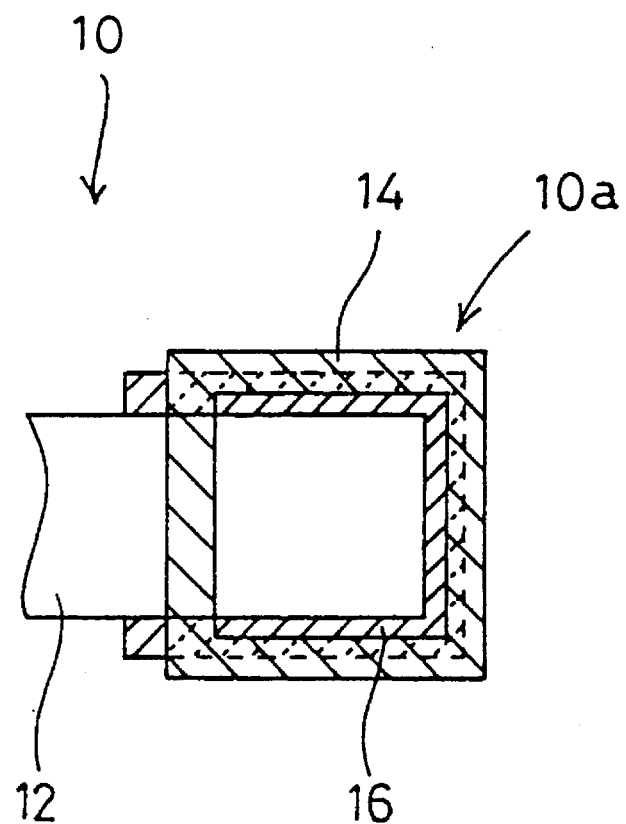
FIG. 4 is a diagrammatic representation showing the cross-section of the sewn part of a flame retardant shielding gasket of a second embodiment of the invention.

A second embodiment of the invention is now explained. As diagrammatically illustrated in FIG. 4, a sewn shielding sheet 10 is composed of an elastomeric sheet 12 formed of flame retardant urethane foam. In the same manner as in the first embodiment, a sewn web material 10a of electrically conductive threads 14 is sewn on the side edge of the elastomeric sheet 12. A resin layer 16 consisting of flame retardant resin having a low melting point is laminated directly to the side surfaces of the elastomeric sheet 12. The electrically conductive threads 14 are partly embedded in the resin layer 16.

The flame retardant resin composing the resin layer 16 is formed by adding a flame retardant agent to a polymer of polyamide, polyester, polyolefin or other thermoplastic resin. The flame retardant agent may be tricresyl phosphate, chlorinated paraffin, antimony oxide, mono-ammonium phosphate, boric acid, brominated polyol, phosphorous-containing polyol, halogenated phthalic anlydride or other flame retarding agent.

During production of the sewn shielding sheet 10, first the side surfaces of the elastomeric sheet 12 to be sewn are coated with a flame retardant resin film having a low melting temperature. The coated side surfaces of the elastomeric sheet are then sewn with the electrically conductive threads 14. After sewing, the sheet 12 is heated to a temperature at which the film is molten, thereby partially embedding the electrically conductive threads 14 into the film and bonding the film to the elastomeric sheet 12. By cooling the elastomeric sheet 12 with the low melting flame retardant film bonded thereto, the resin layer 16, with the electrically conductive threads 14 partly embedded therein, is formed on the peripheral edges of the elastomeric sheet 12.

In the aforementioned sewn shielding sheet 10 of the second embodiment, since the electrically conductive threads 14 are partly embedded in the resin layer 16, the threads 14 are made flame retardant. When the housing containing electronic apparatus is constructed using the sewn shielding sheet 10 of the second embodiment, the safety of the apparatus is enhanced. Moreover, the electrically conductive threads 14 are partly exposed on the outer surfaces of the resin layer 16, thereby maintaining contact with and having electrical conductivity between a compartment and a corresponding lid of the same effectiveness as that of the first embodiment.

In the second embodiment all the peripheral edges to be sewn with the electrically conductive threads 14 are coated with the flame retardant film. However, the resin layer may be formed only on portions that are prone to catching fire.

The resin layer can also be formed on portions to which no electrically conductive threads are to be sewn, thereby providing the elastomeric sheet with enhanced flame resistance.

Figure 5A:
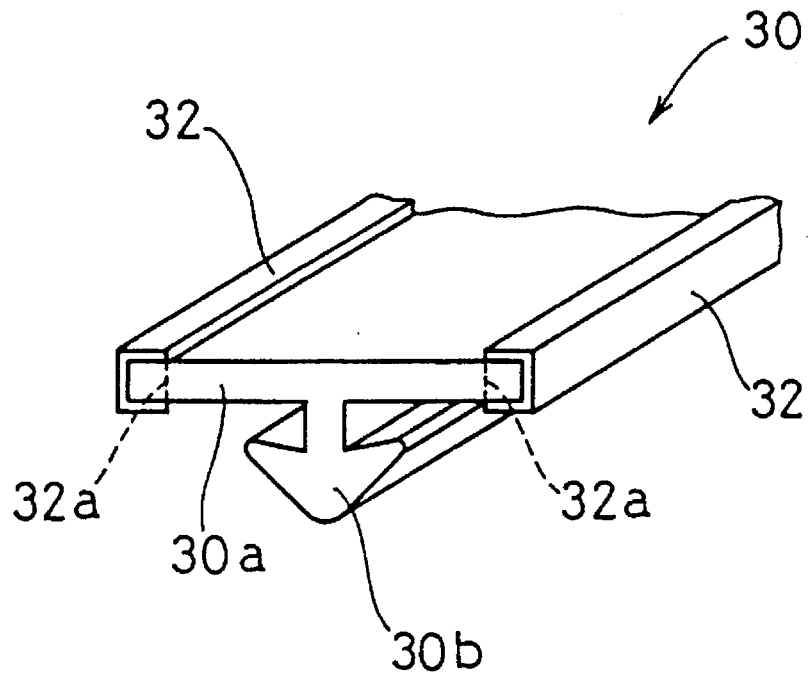
FIGS. 5A and 5B are explanatory views showing the structure and mounting of a sewn shielding gasket of a third embodiment of the invention.

As shown in FIG. 5A, in a third embodiment of the invention, a sewn shielding gasket 30 is composed of a flat body 30a and a anchoring member 30b. The anchoring member 30b projects from the center of the lower surface of the body 30a and the outer end of the anchoring member 30b has an arrow-shaped head. These components are integrally formed of elastomeric material. Both edges of the body 30a are sewn with or surrounded by electrically conductive threads 32.

In FIGS. 5A through 10B, the interwoven electrically conductive threads 32 and other corresponding threads are diagrammatically shown as a sheet or layer for simplicity of illustration. Where the electrically conductive threads 32 are sewn through the body 30a, they are shown as dotted lines 32a.

Figure 5B:
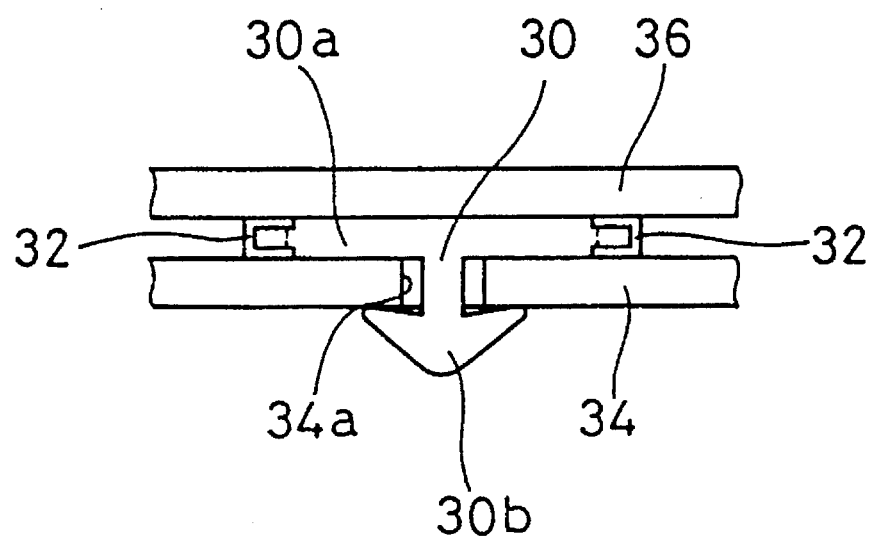

During operation, as shown in FIG. 5B, the shielding gasket 30 is anchored to a housing by inserting the anchoring member 30b into a slit 34a in the housing 34. In this manner the gasket 30 of the third embodiment can be secured to the housing 34 without using any adhesive or other attachment means. The width of the anchoring member 30b is larger than that of the slit 34a, such that the elastic anchoring member 30b is resiliently deformed when passing through the slit 34a and resiliently springs back, locking the anchoring member 30b in the slit 34a.

When a lid 36 is closed, the gap between the lid 36 and the housing 34 is filled by the body 30a of the gasket 30, thereby sealing the gap against intrusion by dust or other contaminants. By contacting both the lid 36 and the housing 34, the electrically conductive threads 32 ensure a continuous electrical path, thereby effectively shielding against electromagnetic waves passing through the gap between the lid 36 and the housing 34. Furthermore, both edges of the body 30a are sewn with the electrically conductive threads 32, thus electromagnetic waves passing through the slit 34a can be prevented from leaking outside the housing 34.

Figure 6A:
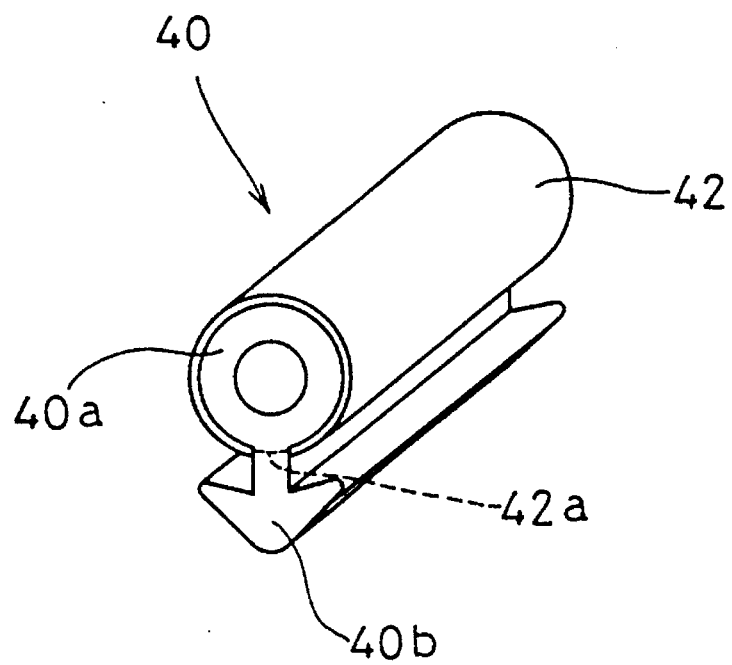
FIGS. 6A and 6B are explanatory views showing the structure and mounting of a sewn shielding gasket of a fourth embodiment of the invention.

As shown in FIG. 6A, in a fourth embodiment the body 40a of a sewn shielding gasket 40 is cylindrical. The entire periphery of the cylindrical body 40a is covered by electrically conductive threads 42. As shown by a dotted line 42a, the electrically conductive threads 42 are sewn through the boundary between the body 40a and an anchoring member 40b.

Figure 6B:
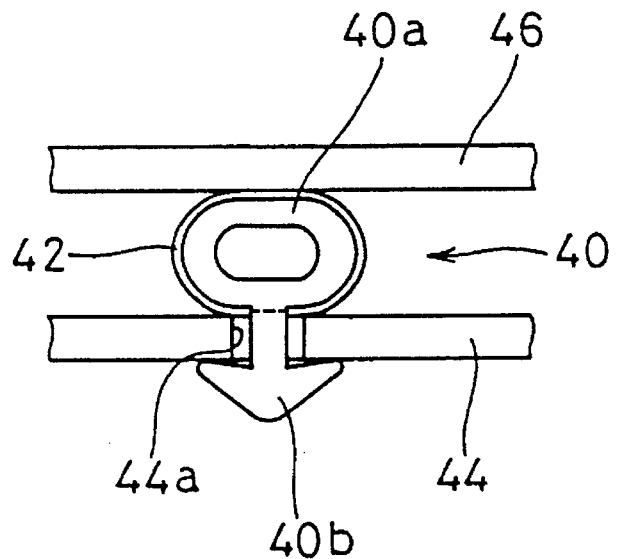

During operation, as shown in FIG. 6B, the anchoring member 44b is inserted through a slit 40a in a housing 44, in the same manner as in the third embodiment, thus the gasket 40 can be easily secured to the housing 44. When a lid 46 is subsequently closed, the body 40a is compressed and deformed between the lid 46 and the housing 44, thereby completely filling the gap therebetween.

The housing 44 is protected against infiltration of dust or other contaminants. The electrically conductive threads 42 deform around the body 40a without creasing thereby ensuring electrical conductivity through the gap for effective shielding against electromagnetic waves. Furthermore, since the deformed body 40a also completely covers the slit 44a, electromagnetic waves are prevented from passing through the slit 44a. Since the body 40a is cylindrical, it can be deformed to a relatively large degree and conform to uneven or irregular gaps.

Figure 7A:
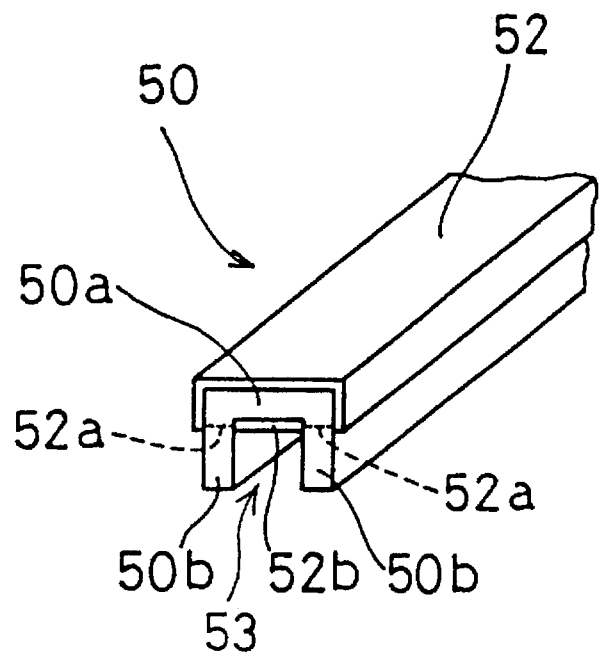
FIGS. 7A and 7B are explanatory views showing the structure and mounting of a sewn shielding gasket of a fifth embodiment of the invention.

As shown in FIG. 7A, in a fifth embodiment of the invention a sewn shielding gasket 50 having a U-shaped cross section is integrally formed of an elastomer. Arms 50b, which are parallel to and spaced from each other, project downwards from both sides of a body 50a. Conductive threads 52 are sewn around the body 50a, through the arms 50b, and are exposed shown as 52b in a groove 53 defined by the body 50a and the arms 50b. As shown by dotted lines 52a, the electrically conductive threads 52 are sewn through the boundary between the body 50a and the arms 50b.

Figure 7B:
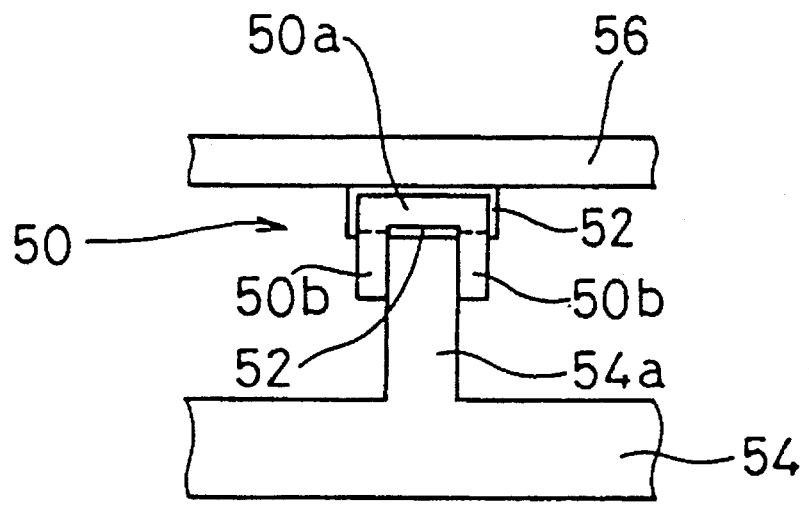

During operation, as shown in FIG. 7B, the gasket 50 is mounted along the edge of a wall or projection 54a defining a compartment in a housing 54. Subsequently, when a lid 56 is closed, the portions of the electrically conductive threads 52 that are exposed around the periphery of the body 50a are in contact with the lid 56, while the portions of the electrically conductive threads 52 that are exposed in the groove are in contact with the projection 54a of the housing 54. Therefore, electrical conductivity is assured between the lid 56 and the housing 54. The body 50a is held between the projection 54a and the lid 56 and fills the gap therebetween. In addition, the electrically conductive threads 52 surrounding the body 50a shield the gap against passage of electromagnetic waves therethrough.

Figure 8A:
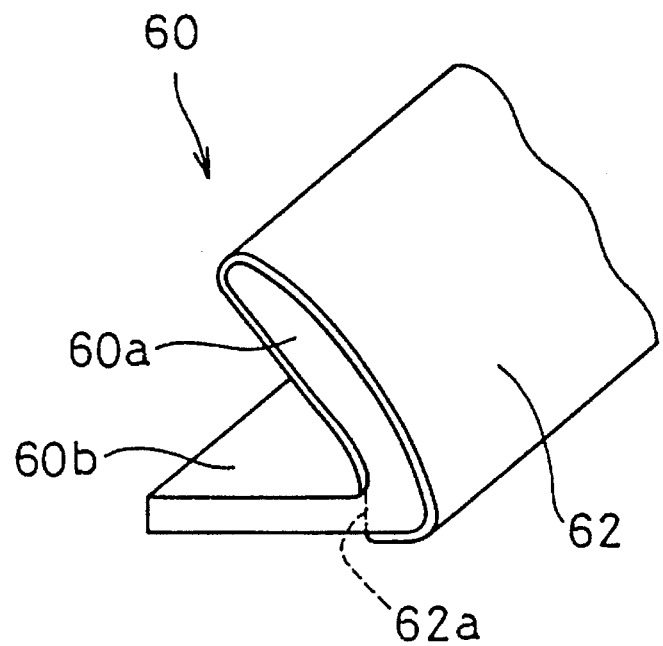
FIG. 8A and 8B are explanatory views showing the structure and mounting of a sewn shielding gasket of a sixth embodiment of the invention.

As shown in FIG. 8A in a sixth embodiment of the invention a sewn shielding gasket 60 is integrally formed of an elastomer. A body 60a projects up from one edge of a flat mounting portion 60b and angles toward the opposite edge of the mounting portion 60b. Electrically conductive threads 62 are sewn around the body 60a. The threads 62 are, as shown by a dotted line 62a, sewn through the boundary between the body 60a and the mounting portion 60b.

Figure 8B:
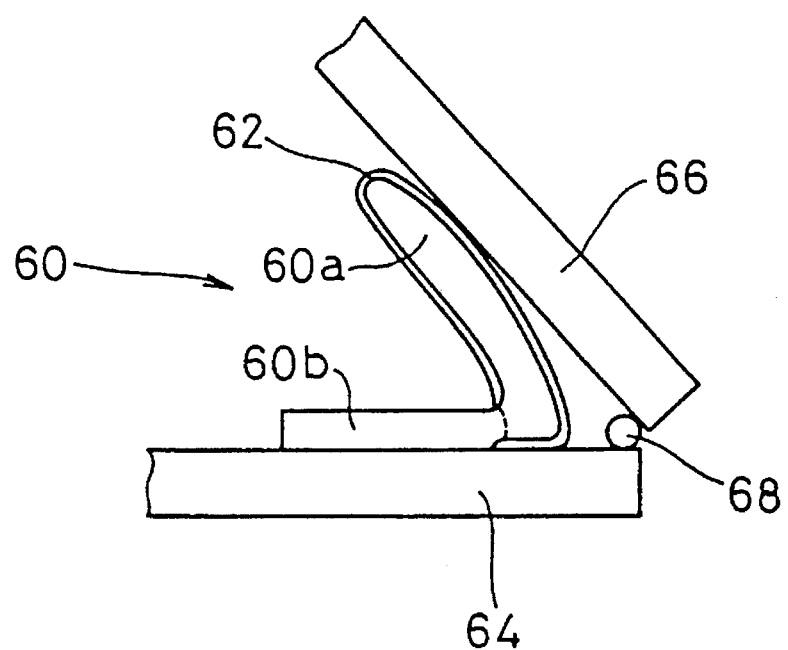

During operation, as shown in FIG. 8B, the edge of the mounting portion 60b, from which the body 60a extends, is placed adjacent to a hinge 68 on which a lid 66 swings to close a housing 64. The mounting portion 60b and the body 60a are bonded to the housing 64 and the lid 66, respectively. Even when the lid 66 is opened, the gasket 60, having an substantially L-shaped cross section, forms a continuous electrical path between the lid 66 and the housing 64, thereby preventing static electricity from accumulating. When the lid 66 is closed, the body 60a is compressed between the lid 66 and the housing 64 and is deformed, thereby filling the gap therebetween. At the same time, the conductive threads 62 sewn around the body 60a shield against the passage of electromagnetic waves between the lid 66 and the housing 64.

Figure 9A:
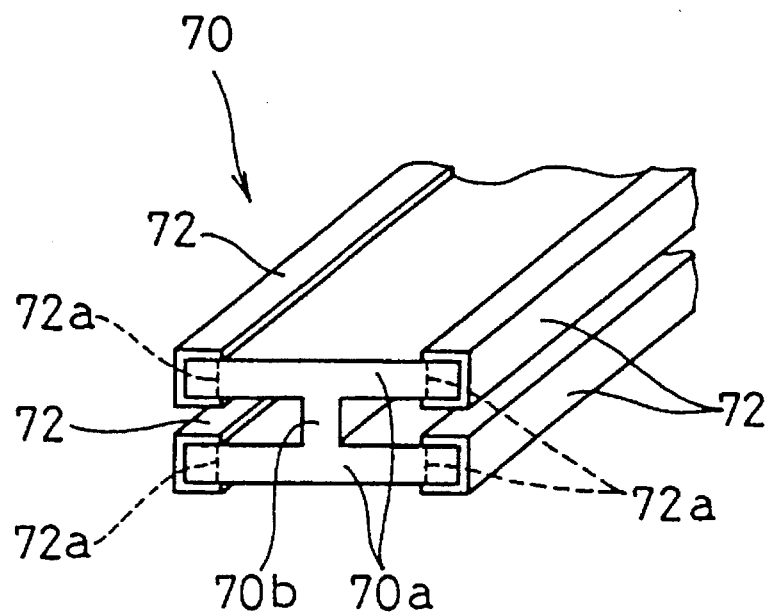
FIGS. 9A and 9B are explanatory views showing the structure and mounting of a sewn shielding gasket of a seventh embodiment.

As shown in FIG. 9A, in a seventh embodiment, a sewn shielding gasket 70 is formed of a pair of parallel spaced plates 70a. The plates 70a are interconnected by a connecting portion 70b, such that the gasket 70 has an H-shaped transverse cross section. Both edges of the plates 70a are surrounded by electrically conductive threads 72. As shown by dotted lines 72a, the electrically conductive threads 72 are sewn through the plates 70a.

Figure 9B:
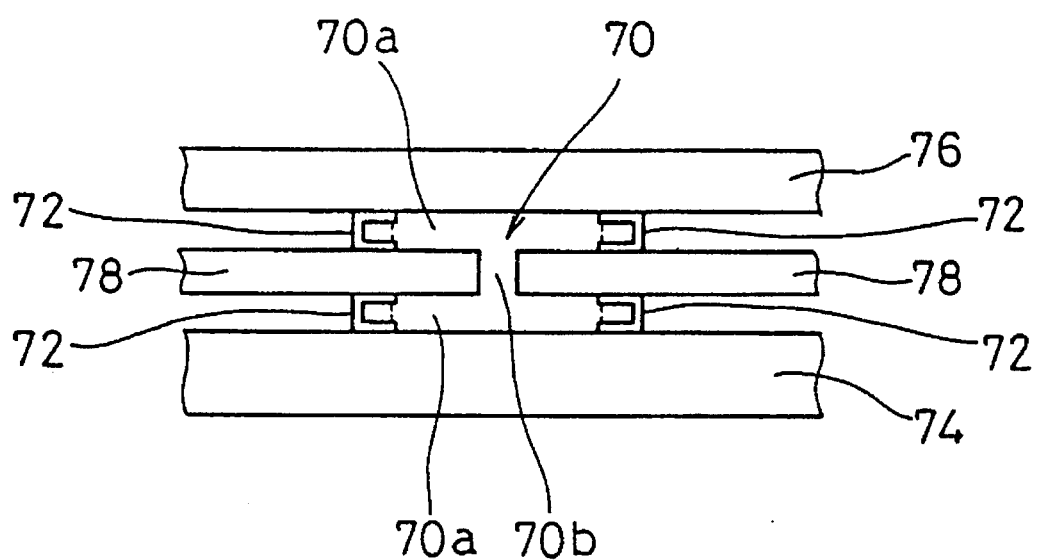

During operation, as shown in FIG. 9B, when the gasket 70 is mounted to a housing 74, substrates 78 supporting electronic circuits or other elements are held between the plates 70a. Therefore, the gasket 70 serves as a spacer for mounting the substrates 78 in the housing 74, with the electronic components arranged on the substrates 78 being spaced from the housing 74. When a lid 76 is closed, the substrates 78 are grounded to the lid 76 and the housing 74, via the conductive threads 72.

Figure 10A:
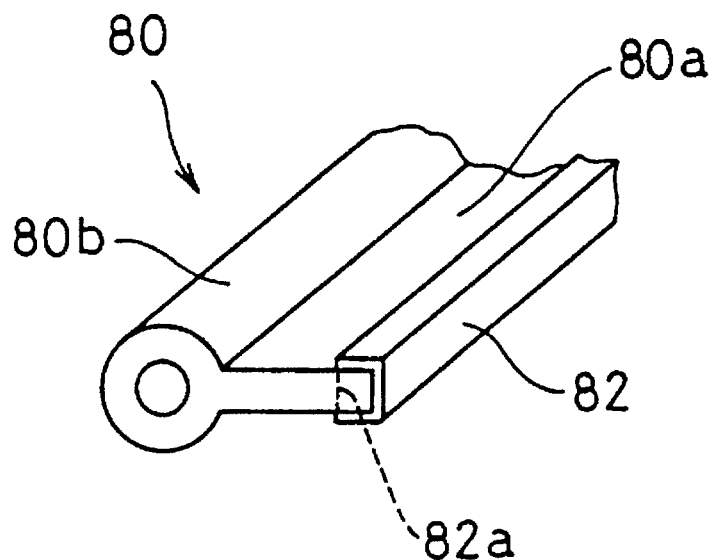
FIGS. 10A and 10B are explanatory views showing the structure and mounting of a sewn shielding gasket of an eighth embodiment.

As shown in FIG. 10A in an eighth embodiment of the invention, a sewn shielding gasket 80 is composed of a flat body 80a and a resilient cylindrical portion 80b formed along one edge of the body 80a. The opposite edge of the body 80a, remote from the cylindrical portion 80b, is surrounded by the electrically conductive threads 82. As shown by a dotted line 82a, the electrically conductive threads 82 are sewn through the body 80a.

Figure 10B:
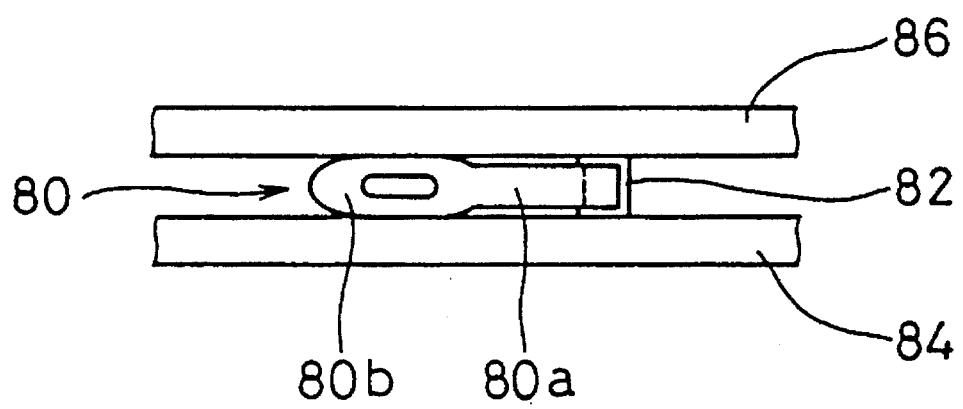

During operation, as shown in FIG. 10B, when the gasket 80 is bonded to an edge defining an opening in a housing 84 and a lid 86 is closed, the cylindrical portion 80b is compressed and deformed, providing a large contact surface with the housing 84 and the lid 86. The gasket 80 can be resiliently deformed to a larger degree than a flat gasket, thereby sealing the gap in the housing 84 more effectively than the flat gasket.

The invention may be embodied in other specific forms without departing from the spirit or essential attributes thereof. Accordingly, reference should be made to the appended claims, rather than to the foregoing specification, as indicating the scope of the invention.

The number of electrically conductive threads is not limited to two. Over-edge chain stitches may be made surrounding the side surfaces of the base material by using a single thread or three or more threads. Alternatively, the over-edge chain stitches do not have to extend completely along the edges.

The electrically conductive threads can be interwoven or sewn onto the base material as closely as the strength of the base material permits. The more densely the threads are sewn, the more effectively the shielding sheet or gasket shields against electromagnetic waves, and the more the structural integrity of the base material is weakened.

The configuration of the sewn shielding sheet or gasket is not limited to the aforementioned shapes. The shape of the gasket can be changed according to the configuration of the part to which the sheet or gasket is to be mounted.

What is claimed is:

1. An electromagnetic wave shielding material comprising a resilient base material having at least one elongate side surface; and
   at least one electrically conductive thread being sewn through said resilient base material at a location spaced from said at least one elongate side surface such that said at least one electrically conductive thread passes completely through said resilient base material at a plurality of locations spaced from and parallel to said at least one elongate side surface, and said at least one electrically conductive thread surrounds and extends along said at least one elongate side surface to shield against electromagnetic waves.

2. A shielding material according to claim 1, wherein said at least one electrically conductive thread is sewn to said resilient base material via an over-edge chain stitch.

3. A shielding material according to claim 2, wherein said over-edge chain stitch includes two separate electrically conductive threads and said over-edge chain stitch extends along said at least one elongate side surface.

4. A shielding material according to claim 1, wherein said resilient base material is at least one of electrically conductive and elongate.

5. A shielding material according to claim 1, wherein said resilient base material is formed of an elastomeric material selected from the group consisting of neoprene, chloroprene, silicone and polyolefin.

6. A shielding material according to claim 4, wherein said resilient base material contains electrically conductive particles therein which provide said resilient base material with a desired electrical conductivity.

7. A shielding material according to claim 6, wherein electrically conductive particles comprise at least one of a carbon material selected from the group consisting of carbon black, carbon fiber, and graphite, and a metal selected from the group consisting of silver, copper, aluminum, chromium, titanium, tungsten, cobalt zinc and alloys of said metals.

8. A shielding material according to claim 1, wherein said resilient base material has a rectangular shape and a rectangular shaped aperture formed therein, said at least one elongate side surface being at least one of an outwardly facing surface of said rectangular shape and an inwardly facing surface of said aperture.

9. A shielding material according to claim 1, wherein said resilient base material supports attachment means for attaching said resilient base material to a desired surface.

10. A shielding material according to claim 2, wherein said at least one electrically conductive thread is at least one of a metallic thread selected from the group consisting of copper, stainless steel and aluminum, a synthetic fiber thread coated with a metal selected from the group consisting of copper, stainless steel and aluminum, and formed from an electrically conductive organic resin material.

11. A shielding material according to claim 1, wherein said resilient base material is donut shaped and said at least one elongate side surface is at least one of an inwardly facing surface of said donut shape and an outwardly facing surface of said donut shape.

12. A shielding material according to claim 1, wherein said resilient base material has a rectangular shape having a plurality of apertures formed therein, said at least one elongate side surface being at least one of an outwardly facing surface of said rectangular shape and at least one inwardly facing surface of said plurality of apertures.

13. A shielding material according to claim 1, wherein said resilient base material is formed from a flame retardant material,
   a flame retardant resin is laminated along said at least one elongate side surface of said flame retardant base material, and
   said at least one electrically conductive thread is sewn through said flame retardant resin and said flame retardant base material.

14. A shielding material according to claim 1, wherein said resilient base material is formed from a flame retardant material,
   a flame retardant resin is laminated along said at least one elongate side surface of said resilient base material, and
   said at least one electrically conductive thread is sewn through said flame retardant resin and said resilient base material.

15. An electromagnetic wave shielding material in combination with a housing having an opening therein and a movable lid being positionable to close the opening, and said electromagnetic wave shielding material being sized to seal a gap formed between the housing and the movable lid to shield against transmission of electromagnetic waves, said electromagnetic wave shielding material comprising a resilient base material having at least one elongate side surface; and
   at least one electrically conductive thread being sewn through said resilient base material at a location spaced from said at least one elongate side surface such that said at least one electrically conductive thread passes completely through said resilient base material at a plurality of locations spaced from but parallel to said at least one elongate side surface, and said at least one electrically conductive thread surrounds and extends along said at least one elongate side surface to shield against transmission of said electromagnetic waves.

16. A shielding material according to claim 15, wherein said resilient base material supports attachment means for attaching said resilient base material to a desired one of the housing and the movable lid.

17. A shielding material according to claim 16, wherein said at least one electrically conductive thread is sewn to said resilient base material via an over-edge chain stitch.

18. A shielding material according to claim 16, wherein said over-edge chain stitch includes two separate electrically conductive threads and said over-edge chain stitch extends along said at least one elongate side surface.

19. A method of shielding a component to minimize penetration of electromagnetic waves through a gap formed in the component, said method comprising the steps of:

employing a resilient base material having at least one elongate side surface;

sewing at least one electrically conductive thread through said resilient base material at a location spaced from said at least one elongate side surface such that said at least one electrically conductive thread passes completely through said resilient base material at a plurality of locations spaced from but parallel to said at least one elongate side surface and said at least one electrically conductive thread surrounds and extends along said at least one elongate side surface to shield against transmission of said electromagnetic waves; and attaching said resilient base material with said at least one electrically conductive thread sewn along said at least one elongate side surface thereof in the gap of the component to minimize penetration of said electromagnetic waves through the gap.

20. A method according to claim 19, further comprising the step of sewing said at least one electrically conductive thread to said resilient base material via an over-edge chain stitch.

* * * * *